(12) United States Patent
Avci et al.

(10) Patent No.: US 11,495,596 B2
(45) Date of Patent: Nov. 8, 2022

(54) LOGIC-EMBEDDED DIODE/TUNNEL DIODE COUPLED TO FLOATING GATE WITH I-V CHARACTERISTICS SUITABLE FOR LOGIC STATE RETENTION

(71) Applicant: Intel Corporation, Santa Clara, CA (US)

(72) Inventors: Uygar E. Avci, Portland, OR (US); Daniel H. Morris, Hillsboro, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 894 days.

(21) Appl. No.: 16/147,512

(22) Filed: Sep. 28, 2018

(65) Prior Publication Data
US 2020/0105743 A1 Apr. 2, 2020

(51) Int. Cl.
| | |
|---|---|
| H01L 27/06 | (2006.01) |
| H01L 27/07 | (2006.01) |
| H01L 25/18 | (2006.01) |
| H01L 29/51 | (2006.01) |
| H01L 27/02 | (2006.01) |
| H01L 29/88 | (2006.01) |
| H01L 27/11519 | (2017.01) |

(52) U.S. Cl.
CPC .......... *H01L 27/0727* (2013.01); *H01L 25/18* (2013.01); *H01L 27/0255* (2013.01); *H01L 29/517* (2013.01); *H01L 29/88* (2013.01); *H01L 27/11519* (2013.01)

(58) Field of Classification Search
CPC .................................................. H01L 27/0629
See application file for complete search history.

(56) References Cited

U.S. PATENT DOCUMENTS

2019/0079575 A1* 3/2019 Hanson ................. G06F 1/3237

* cited by examiner

*Primary Examiner* — Christopher A Johnson
(74) *Attorney, Agent, or Firm* — Schwabe Williamson & Wyatt PC (57) ABSTRACT

An integrated circuit structure comprises a substrate having a memory region of and an adjacent logic region. A first N type well (Nwell) is formed in the substrate for the memory region and a second Nwell formed in the substrate for the logic region. A plurality of memory transistors in the memory region and a plurality of logic transistors are in the logic region, wherein ones the memory transistors include a floating gate over a channel, and a source and a drain on opposite sides of the channel. A diode portion is formed over one of the source and the drain of at least one of the memory transistors to conduct charge to the floating-gate of the at least one of the memory transistors for state retention during power gating.

15 Claims, 9 Drawing Sheets

LOGIC-EMBEDDED DIODE/TUNNEL DIODE COUPLED TO FLOATING GATE WITH I-V CHARACTERISTICS SUITABLE FOR LOGIC STATE RETENTION

TECHNICAL FIELD

Embodiments of the disclosure are in the field of integrated circuit structures and, in particular, a logic-embedded diode/tunnel diode coupled to a floating gate with I-V characteristics suitable for logic state retention.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and state-of-the-art fabrication processes may limit the possibility to further extend them into the sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

A logic-embedded diode/tunnel diode coupled to a floating gate with I-V characteristics suitable for logic state retention are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Integrated circuit leakage energy is reduced by power gating, which shuts off current to blocks of the circuit that are not in use. However, flip-flop and latch logic state is typically lost once the power supply is removed. Previous solutions to solve this problem have included i) latches connected to always on power supply, 2) embedded memory such as RRAM, MRAM, or eFlash, in the latch, and 3) eFlash formed with logic-transistors by floating gates, metal finger capacitor control gates, and standard gate oxide.

However, each of these solutions has disadvantages. Latches connected to an always on power supply require the overhead of routing and regulating additional voltage rails. Product designs targeting high performance processors have been unable to successful adopt this approach.

Embedded non-volatile (NV) memory increase process cost and complexity substantially. For maximum benefit, state storage must be integrated directly in high-performance logic. This requires a process robust to arbitrary layout environments, layout densities and small logic-to-memory transition regions. Most existing NV memories also consume too much write power.

A recently proposed technique uses standard logic transistors with (a) the control-gate formed from metal-finger or trench contact (TCN-GATE) capacitors; (b) the floating gate formed from logic gate; and (c) tunnel oxide formed from the standard logic oxide. The transistor writes uses gate leakage to at a high voltage and reads in a low voltage. This technique provides good retention for "frequently-on/mostly-off" applications with standard gate oxide (GOX). However, applications must commence power gating following a minimum voltage (VMIN) operation mode, and such a transistor cannot operate at a very low voltage or use VMIN. In addition, exponential voltage-current relationship of standard gate oxide tunneling had not been measured to be sufficiently steep, meaning that the write voltage v. retention time trade-off is insufficient.

One or more embodiments described herein are directed to structures and architectures for fabricating a logic-embedded diode/tunnel diode coupled to a floating gate, which retains logic state during power gating. The logic-embedded diode/tunnel diode of the present embodiments provide an improved write voltage vs retention time trade-off. Embodiments may include or pertain to one or more of back end transistors, embedded diodes, tunnel diodes, floating gate transistors, and system-on-chip (SoC) technologies. One or more embodiments may be implemented to power gating of logic to reduce leakage power in SoCs of future technology nodes.

Figure 2A:
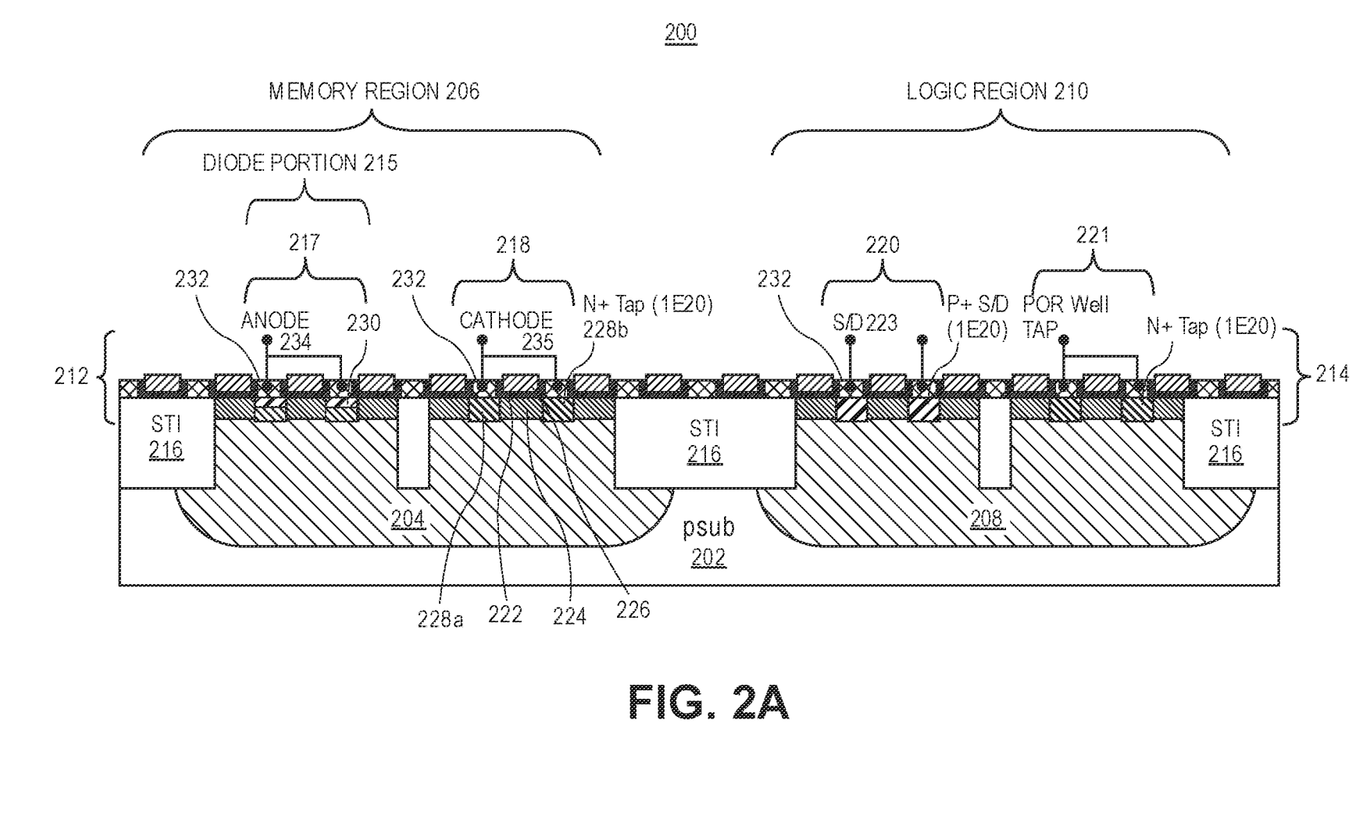
FIGS. 2A and 2B are diagrams illustrating example diode modifications made to a MOSFET structure and a tunnel field effect transistor (TFET) structure, respectively, in accordance with the disclosed embodiments.

A dielectric layer (not shown) may be formed over the resultant topography of MOSFET structure 200 (i.e., substrate 202, gate dielectric layer 222, gate 226, source/drain portion 228) and patterning one or more features (e.g., trenches; through-holes; single-damascene openings; double-damascene openings) therein. The material composition of dielectric layer may be customized, as desired for a given target application or end-use. In some cases, dielectric layer may be formed from any one, or combination, of dielectric materials, such as, for example, silicon dioxide (SiO2), aluminum oxide (Al2O3), hafnium oxide (HfO2), zirconium dioxide (ZrO2), tantalum pentoxide (Ta2Os), titanium dioxide (TiO2), and lanthanum oxide (La2O3), among others, a carbon (C)-doped oxide, a nitride, such as silicon nitride (Si3N4), or a carbide, such as silicon carbide (SiC). In a more general sense, and in accordance with some embodiments, dielectric layer may be formed from any one, or combination, of the aforementioned materials. Dielectric layer may be formed via any suitable standard, custom, or proprietary technique(s), as will be apparent in light of this disclosure. In some cases, dielectric layer may be formed, for example, via any one, or combination, of a CVD process and a PVD process. In some cases, dielectric layer may be configured to serve as an inter-layer dielectric (ILD).

There are many technical effects of the various embodiments. For example, the diode modified transistor reduces leakage power by enabling fast save-restore time due to logic state retention. The diode modified transistor enables low write energy vs other pseudo-non-volatile technology. In addition, the power-gating solutions based on the diode modified transistor is a low cost process technology and simple to embed in high-performance logic.

Some embodiments add the diode to a floating-gate scheme that is built on a complementary metal oxide semiconductor (CMOS) process without special memory-specific processing steps. For example, to retain a state of a memory storage node, specialized non-volatile memory devices such as magnetic tunneling junction (MTJ) are not needed. In some embodiments, a standard metal gate, which is used for other transistors or devices of an IC, is used to form a floating-gate device.

Figure 1:
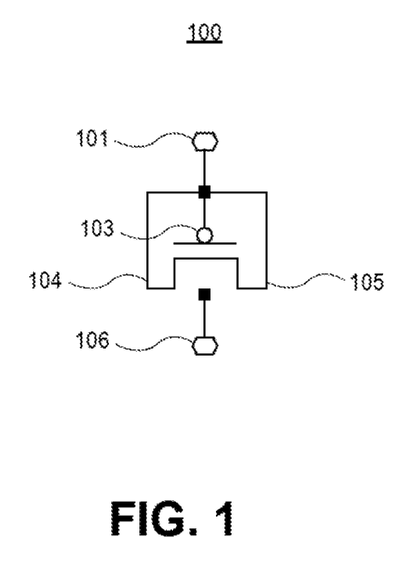
FIG. 1 illustrates transistor model 100 according to some embodiments of the disclosure.

FIG. 1 illustrates transistor model 100 according to some embodiments of the disclosure. Transistor model 100 comprises a control-gate node 101, gate node 103, source node 104, drain node 105, bulk (body or substrate) node 106. In this example, a p-type floating-gate transistor is shown. However, a similar model can be made for an n-type floating-gate transistor using the same principles. In some embodiments, the source node 104 and the drain node 105 are coupled together. In some embodiments, the gate node 103 is a floating gate. In some embodiments, a diode is implemented with a contact layer (e.g., a conductive metal layer used for near active region interconnections or contacts). As such, the contact layer performs a function of a control gate which may capacitively charge or discharges the floating-gate. One example of the contact layer is a trench contact layer (also referred to as TCN) which forms the TCN gate (also referred to as the control-gate). In some embodiments, control-gate node 101 is formed from the TCN to form a TCN gate, which also referred to as the control-gate. In some embodiments, the TCN contact material includes one of: Tungsten, Tantalum, Titanium, Nickel, or Aluminum.

Figure 2B:
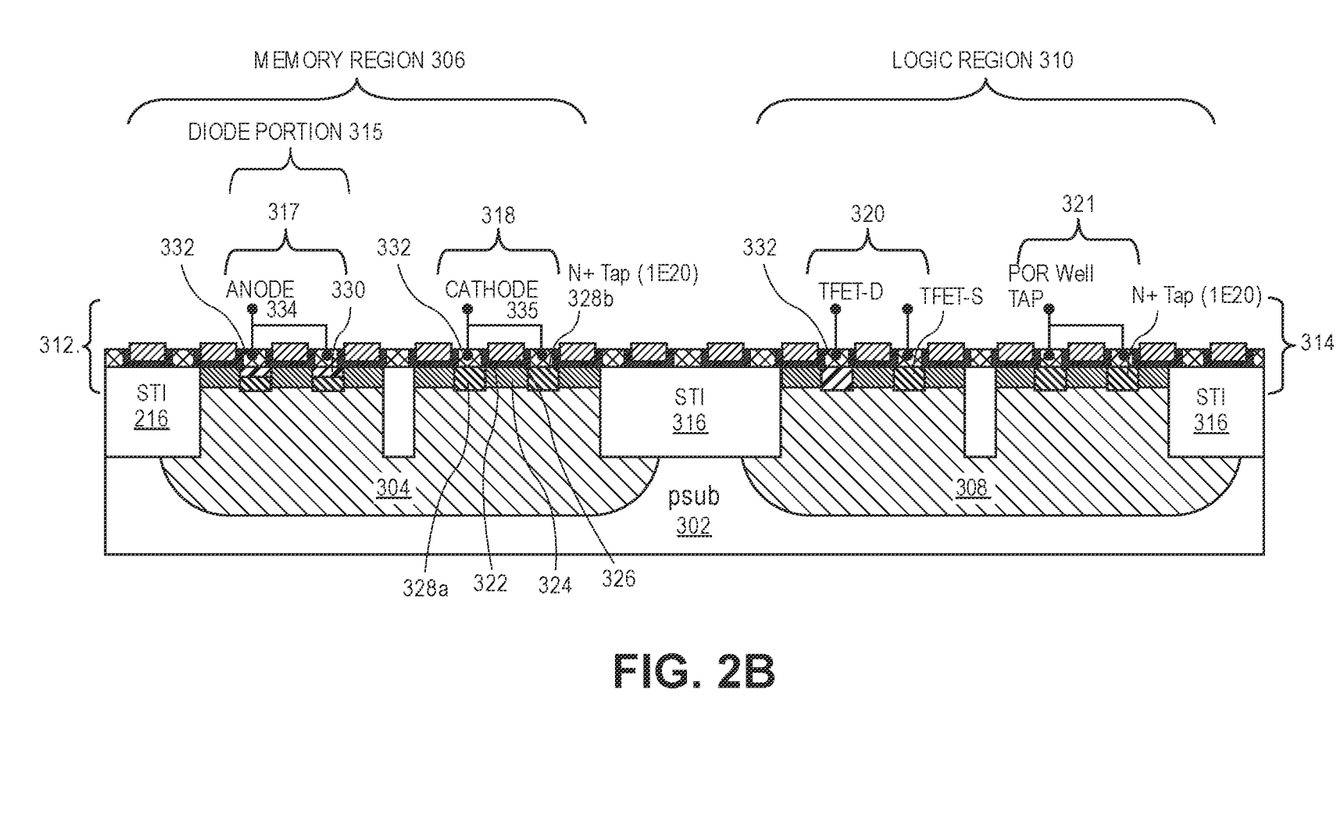

FIGS. 2A and 2B are diagrams illustrating example diode modifications made to a MOSFET structure and a tunnel field effect transistor (TFET) structure, respectively, in accordance with the disclosed embodiments. These include modifications to Nwell doping, S/D doping or epi; layout configuration for layout-dependent stress/strain; or heterojunction formation on the source drain. These changes may be implemented in a single mask and do not require critical dimension patterning or alignment.

FIG. 2A shows a first embodiment of diode modifications made to a MOSFET structure 200. The MOSFET structure 200 is formed on a P type substrate (P SUB) 202 having a memory region 206 of memory transistors 212 and an adjacent logic region 210 of logic transistors 214. A first N type well (Nwell) 204 is formed in a substrate 202 for the memory region 206 and a second Nwell 208 is formed in a substrate 202 for the logic region 210. In this embodiment, the memory transistors 212 comprise MOSFET memory transistors 212 and the logic transistors 214 comprise MOSFET logic transistors 214. Shallow trench isolation (STI) 216 is located between areas of transistors to prevent electric current leakage between adjacent semiconductor components. In one embodiment, the first Nwell 204 is optimized for retention-diode characteristics. The logic region 210 includes a MOSFET 220 and a standard well tap 221, and the memory region 206 includes a well tap 218 and a TFET 217 that has been modified to include a diode portion 215.

Specifically, memory transistors 212 in a diode region 215 are modified to include a drain-to-Nwell (or source-to-in Nwell) diode such that exponential I-V curve of the diode is used to conduct charge to an otherwise 'floating-gate' of the memory transistors 212 for state retention during power gating. The diode enables VMIN write, unlike other non-volatile technologies. The characteristic of the diode may further be improved by suitable doping levels, doping profiles, and layout-induced strain all achieved using an inexpensive mask and processes compatible with high performance transistors and interconnect.

Semiconductor substrate 202 may have any of a wide range of configurations. For instance, in some embodiments, semiconductor substrate 202 may be a bulk semiconductor substrate, a semiconductor-on-insulator (XOI, where X represents a semiconductor material), a semiconductor wafer of any standard, custom, or other desired size (e.g., a standard 300 mm wafer), or a multi-layered structure. The material composition of semiconductor substrate 202 may be customized, as desired for a given target application or end-use. For instance, in some cases, semiconductor substrate 202 may be formed from any one, or combination, of silicon (Si), germanium (Ge), and silicon-germanium (SiGe), among others. In an example case, semiconductor substrate 202 may be formed, at least in part, from Si having a crystal lographic orientation of <1 1 1>, generally referred to as Si(111). Other suitable materials and configurations for semiconductor substrate 202 will depend on a given application.

The memory transistors 212 and the logic transistors 214 comprise similar components. For example, a gate dielectric layer 222 is formed over a channel 224 of the substrate 202, and a gate 226 is formed over the gate dielectric layer 222. The material composition of gate dielectric layer 222 may be customized, as desired for a given target application or end-use. In some cases, gate dielectric layer 222 may be formed from any one, or combination, of high-K dielectric materials, such as, for example, aluminum oxide (Al2O3), hafnium oxide (HfO2), silicon dioxide (SiO2), silicon nitride (Si3N4), and zirconium dioxide (ZrO2), among others. Gate dielectric layer 222 can be formed via any suitable standard, custom, or proprietary technique(s), as will be apparent in light of this disclosure. In some cases, gate dielectric layer 222 may be formed via any one, or combination, of a chemical vapor deposition (CVD) process and an atomic layer deposition (ALD) process. Also, the geometry and dimensions of gate dielectric layer 222 may be customized, as desired for a given target application or end-use. In some cases, gate dielectric layer 222 may have a thickness (a y-thickness in the y-direction), for example, in the range of about 1-10 nm (e.g., about 1-5 nm, about 5-10 nm, or any other sub-range in the range of about 1-10 nm). Other suitable materials, formation techniques, and configurations for gate dielectric layer 222 will depend on a given application and will be apparent in light of this disclosure.

The material composition of gate 226 may be customized, as desired for a given target application or end-use. In some cases, gate 226 may be formed from any one, or combination, of electrically conductive materials, such as, for example, copper (Cu), aluminum (Al), tungsten (W), nickel (Ni), cobalt (Co), silver (Ag), gold (Au), titanium (Ti), tantalum (Ta), titanium nitride (TiN), tantalum nitride (TaN), and doped or undoped polysilicon (poly-Si), among others. Gate 226 can be formed via any suitable standard, custom, or proprietary technique(s), as will be apparent in light of this disclosure. In some cases, gate 226 may be formed via any one, or combination, of a physical vapor deposition (PVD) process, a CVD process, an electroplating process, and an electroless deposition process. Also, the geometry and dimensions of gate 226 may be customized, as desired for a given target application or end-use. Other suitable materials, formation techniques, and configurations for gate 226 will depend on a given application and will be apparent in light of this disclosure.

The memory transistors 212 and the logic transistors 214 further include source portion 228a and drain portion 228b (referred to as source/drain portions 228) that are formed on opposite sides of the channel 224 of semiconductor substrate 202. The material composition of each of source portion 228a and drain portion 228b may be customized, as desired for a given target application or end-use. In some cases, at least one of source portion 228a and drain portion 228b may be formed, for example, from any one, or combination, of Si, SiGe, and Ge, any of which may be highly doped with an n-type or p-type dopant, as desired. Arsenic (As) and phosphorous (P) are some examples of suitable n-type dopants. Boron (B) is an example of a suitable p-type dopant.

In an example case, the Nwell 204 may have the lowest doping level of N−, the channel 224 may have a slightly higher doping level of N+, and both source/drain portions 228 may be highly doped with an n-type dopant, resulting in N++ source/drain portions 228. More specifically, in one embodiment, the Nwell 204 may be doped at a level of 1E15 to 1E16 cm"3, the channel 224 may be doped at a level of 1E16 to 1E18 cm"3, and the source/drain portions 228 may be doped at a level of 1E20 cm"3. In another example case, however, both source portion 228a and drain portion 228b may be highly doped with a p-type dopant, resulting in P++ source/drain portions 228. In a more general sense, and in accordance with some embodiments, the dopant type and concentration, as well as the doping profile (e.g., dopant gradient or other variation, if any), for each of source portion 228a and drain portion 228b may be customized.

In some cases, either (or both) of source/drain portions 228 may be formed over semiconductor substrate 202, such that a given source/drain portions 228 is in contact with or otherwise disposed over an upper surface of semiconductor substrate 202. In some other cases, either (or both) of source/drain portions 228 may be formed at least partially within semiconductor substrate 202, such that a given portion 228/210 at least partially extends below an upper surface of semiconductor substrate 202. In some still other cases, either (or both) of source/drain portions 228 may be formed both over and at least partially within semiconductor substrate 202, such that a given source/drain portions 228 is at least partially in contact with or otherwise disposed over an upper surface of semiconductor substrate 202 and at least partially extends below the upper surface of semiconductor substrate 202.

Source portion source/drain portions 228 may be formed via any suitable standard, custom, or proprietary technique(s), as will be apparent in light of this disclosure. In some cases, either (or both) of source/drain portions 228 may be formed via any one, or combination, of an implant process and an epitaxial deposition process. Also, the geometry and dimensions of source/drain portions 228 may be customized, as desired for a given target application or end-use. In some cases, either (or both) of source/drain portions 228 may extend above the plane of the upper surface of channel 224 of semiconductor substrate 202. In other cases, either (or both) of source/drain portions 228b may be substantially co-planar with the upper surface of channel 224 of semiconductor substrate 202. Furthermore, as will be appreciated in light of this disclosure, and in accordance with some other embodiments, source/drain portions 228 may be transposed, such that drain portion 228b resides instead where source portion 228a is currently depicted in FIGS. 2A-2B, and source portion 228a resides instead where drain portion 228b is currently depicted in FIGS. 2A-2B. Other suitable materials, formation techniques, and configurations for source/drain portions 228 will depend on a given application and will be apparent in light of this disclosure.

A dielectric layer (not shown) may be formed over the resultant topography of MOSFET structure 200 (i.e., substrate 202, gate dielectric layer 222, gate 226, source/drain portion 228) and one or more features (e.g., trenches; through-holes; single-damascene openings; double-damascene openings) may be patterned therein. The material composition of dielectric layer may be customized, as desired for a given target application or end-use. In some cases, dielectric layer may be formed from any one, or combination, of dielectric materials, such as, for example, silicon dioxide (SiO2), aluminum oxide (Al2O3), hafnium oxide (HfO2), zirconium dioxide (ZrO2), tantalum pentoxide (Ta2Os), titanium dioxide (TiO2), and lanthanum oxide (La2O3), among others, a carbon (C)-doped oxide, a nitride, such as silicon nitride (Si3N4), or a carbide, such as silicon carbide (SiC). In a more general sense, and in accordance with some embodiments, a dielectric layer may be formed from any one, or combination, of the aforementioned materials. The dielectric layer may be formed via any suitable standard, custom, or proprietary technique(s), as will be apparent in light of this disclosure. In some cases, the dielectric layer may be formed, for example, via any one, or combination, of a CVD process and a PVD process. In some cases, the dielectric layer may be configured to serve as an inter-layer dielectric (ILD).

In the logic region 210, transistor 220 has an epitaxial p-type or n-type material that is doped opposite (P++) the underlying source/drain material with source/drain contacts 232 formed there over. Adjacent transistor 221 has N++ source and drains 228 coupled to together to form a well tap.

According to the present disclosure, one or more of the memory transistors 212 in the memory region 206 is modified to include a diode portion 215. A p-n junction of the diode portion 215 can be formed, for example, using the material comprising source/drains 228a and 228b and an additional diode material layer 230 provided there over. In accordance with some embodiments, the diode material may be, for example, an epitaxial p-type or n-type material that is doped opposite the underlying source/drain material. A source contact 232 may be formed over the diode material layer 230 and configured for electronic contact with the source portion through the diode portion. Together, the oppositely doped source portion 228a and diode material layer 230 may constitute at least a portion of a P+/N+ diode, which, in accordance with some embodiments, is used to retain the logic state of the memory device during power gating. In one embodiment, an anode portion 234 couples together P+ diode material of the source and drains 228, and a cathode portion 235 couples together the N+ of the source and drains 228 to form a N+ tap in an adjacent well tap 218. In one embodiment, materials used in one or more of the diode material layer 230, source contact 232, and source and drains 228a and 228b may be N or P-type doped, InAs, GaSb, InGaAs, Ge, InP, GaAs or TMD materials.

The diode portion 215 may be fabricated by first masking off feature(s) within dielectric layer (e.g., over gate 226) where formation of a diode material layer 230 is not desired and forming the diode portion 215 in feature(s) within dielectric layer over source/drain portions 228 where formation is desired. Masking may be performed via any suitable standard, custom, or proprietary masking technique(s).

The composition of diode material layer 230 may be customized, as desired for a given target application or end-use. The dopant concentration, as well as the doping profile (e.g., dopant gradient or other variation, if any), for diode material layer 230 may be customized. In some cases, diode material layer 230 may have a dopant concentration, for example, in the range of about 1E20-1 E22 cm"3 (e.g., about 1E20-1E21 cm"3, about 1 E21-1E22 cm"3, or any other sub-range). If source portion 228a is n-doped, for example, then diode material layer 230 may be any one, or combination, of highly p-doped Si, SiGe, and Ge, resulting in a P+ diode material layer 230. If instead source portion 228a is p-doped, for example, then diode material layer 230 may be any one, or combination, of highly n-doped Si, SiGe, and Ge, resulting in an N+ diode material layer 230. In either case, the P+ or N+ diode material layer 230 over source/drains 228, may provide a diode portion 215 in accordance with some embodiments. In one embodiment, materials used in one or more of the diode material layer 230, source contact 232, and source and drains 228a and 228b may be N or P-type doped, InAs, GaSb, InGaAs, Ge, InP, GaAs or TMD materials.

Diode portion 215 may be formed via any suitable standard, custom, or proprietary technique(s), as will be apparent in light of this disclosure. In some cases, diode portion 215 may be formed via any one, or combination, of a molecular beam epitaxy (MBE) process and a metalorganic vapor phase epitaxy (MOVPE) process. Also, the dimensions of diode portion 215 may be customized, as desired for a given target application or end-use, and in some cases may depend, at least in part, on dimensions of the feature of dielectric layer in which it resides. For instance, as can be seen from FIGS. 2A-2B, the width (x-width in the x-direction) of diode portion 215 may be about equal (e.g., within about 5%) to the width of the bottom of the feature over source portion 228a in which it resides. In some cases, diode portion 215 may have a width (x-width), for example, in the range of about 5-1,000 nm (e.g., about 5-500 nm, about 500-1,000 nm, or any other sub-range in the range of about 5-1,000 nm). In some instances, diode portion 215 may have a width (x-width) in the range of about 20-30 nm. In some cases, diode portion 215 may have a thickness (y-thickness in the y-direction) in the range of about 5-500 nm (e.g., about 5-250 nm, about 250-500 nm, or any other sub-range in the range of about 5-500 nm). In some instances, diode portion 215 may have a thickness (y-thickness), for example, in the range of about 20-50 nm. In some instances, diode portion 215 may have a substantially uniform y-thickness over the topography provided, for example, by underlying source portion 208. In other instances, diode portion 215 may be provided with a non-uniform or otherwise varying y-thickness over such topography. For example, in some cases, a first portion of diode portion may have a y-thickness within a first range, whereas a second portion thereof may have a y-thickness within a second, different range. In some instances, diode portion may have first and second portions, for example, having average y-thicknesses that are different from one another by about 20% or less, about 15% or less, about 10% or less, or about 5% or less.

Furthermore, the geometry of diode portion 215 may be customized, as desired for a given target application or end-use, and in some cases may depend, at least in part, on the geometry of the feature of dielectric layer in which it resides. In some cases, diode portion 215 may have angled or tapered sidewalls, resulting in a generally trapezoidal cross-sectional geometry. In some other cases, however, diode portion 215 may have substantially straight, vertical sidewalls, resulting in a generally rectangular or square cross-sectional geometry. In some still other cases, diode portion 215 may have one or more curvilinear surfaces (top, sidewalls, or other).

After formation of diode portion 215, the mask is removed from feature(s) within dielectric layer and source/drain contacts 232 are formed over the diode material layer 230 and source/drains 228. In some cases, source/drain contacts 232 may be formed from any suitable electrically conductive material(s), as will be apparent in light of this disclosure. In some cases, source/drain contacts 232 may be formed from any one, or combination, of electrically conductive materials, such as, for example, nickel (Ni), gold (Au), platinum (Pt), titanium (Ti), aluminum (Al), and tungsten (W), among others. Also, the geometry and dimensions of each of source and drain contacts 232 can be customized, as desired for a given target application or end-use, and in some cases may depend, at least in part, on the geometry of the features of dielectric layer in which they reside. In accordance with some embodiments, the source contact may be configured, for example, for electronic contact with underlying source portion 228a through diode material layer 230.

FIG. 2B shows a second embodiment of diode modifications made to tunnel field effect transistor (TFET) structure 300. The architecture is similar to FIG. 2A, but instead of modifying MOSFETs, FIG. 2B shows the modification of TFETS. A P type substrate (PSUB) 302 includes a memory region 306 of memory transistors 312 and an adjacent logic region 310 of logic transistors 314. A first N type well (Nwell) 304 is formed in the substrate 302 for a memory region 306 and a second Nwell 308 formed in the substrate 302 for an adjacent logic region 310. Shallow trench isolation (STI) 316 is located between areas of transistors to prevent electric current leakage between adjacent semiconductor components. In one embodiment, the first Nwell 304 is optimized for retention-diode characteristics. The logic region 310 includes a TFET 320 and a standard well tap 321 and the memory region 306 includes a well TFET 318 and a TFET 317 that has been modified to include a diode portion 315.

In this second embodiment, more substantial process changes are made to the source/drain of the TFET 317 to create tunnel diode portions 315 for even lower-voltage and longer retention. Such options complement beyond-CMOS devices, such as tunnel FETs and Fermi-filter FETS. Additionally, other ultra-low voltage (yet high leakage) beyond-CMOS device may require such highly granular power gating. For example the above approach may be useful in conjunction with using BJTs for scaled low voltage beyond-CMOS logic.

The memory transistors 312 and the logic transistors 314 comprise similar components. For example, a gate dielectric layer 322 is formed over a channel 324 of the substrate 302, and a gate 326 is formed over the gate dielectric layer 322. The memory transistors 312 and the logic transistors 314 further include source portion 328a and drain portion 328b (referred to as source/drain portions 328) are formed adjacent to the channel 324 of semiconductor substrate 302. The material composition of each of source portion 328a and drain portion 328b may be customized, as desired for a given target application or end-use.

In an example case, the Nwell 304 may have the lowest doping level of N−, the channel 324 may have a slightly higher doping level of N+, and both source/drain portions 328 may be highly doped with an n-type dopant, resulting in N++ source/drain portions 328. More specifically, in one embodiment, the Nwell 304 may be doped at a level of 1E15 to 1E16 cm"3, the channel 324 may be doped at a level of 1E16 to 1E18 cm"3, and the source/drain portions 328 may be doped at a level of 1E20 cm"3. In another example case, however, both source portion 328a and drain portion 328b may be highly doped with a p-type dopant, resulting in P++ source/drain portions 328. In a more general sense, and in accordance with some embodiments, the dopant type and concentration, as well as the doping profile (e.g., dopant gradient or other variation, if any), for each of source portion 328a and drain portion 328b may be customized.

A dielectric layer (not shown) may be formed over the resultant topography of TFET structure 300 (i.e., substrate 302, gate dielectric layer 322, gate 326, source/drain portion 328) and patterning one or more features (e.g., trenches; through-holes; single-damascene openings; double-damascene openings) therein.

According to the present disclosure, one or more of the memory transistors 312 in the memory region 306 is modified to include a tunnel diode portion 315. The modifications may include modifications to Nwell doping, source/drain doping or epi; layout configuration for layout-dependent stress/strain; or heterojunction formation on the source drain. These changes may be implemented in a single mask and do not require critical dimension patterning or alignment.

A p-n junction of the tunnel diode portion 315 can be formed, for example, using the source/drain material and an additional diode material layer 330 provided there over. In accordance with some embodiments, the diode material may be, for example, an epitaxial p-type or n-type material that is doped opposite the underlying source/drain material. A source contact 332 may be formed over the diode material layer 330 and configured for electronic contact with the source portion through the diode portion. Together, the oppositely doped source region and diode material layer 330 may constitute at least a portion of a P+/N+ tunnel diode, which, in accordance with some embodiments, is used to retain the logic state of the memory device during power gating. In one embodiment, an anode portion 334 couples together P+ diode material of the source and drains 328, and a cathode portion 235 couples together the N+ of the source and drains 328 to form a N+ tap of an adjacent transistor 318.

The tunnel diode portion 315 may be fabricated by first masking off feature(s) within dielectric layer (e.g., over gate 324) where formation of a diode material layer 330 is not desired and forming the diode portion 315 in feature(s) within dielectric layer over source/drain portions 328 where formation is desired. Masking may be performed via any suitable standard, custom, or proprietary masking technique (s).

The composition of diode material layer 330 may be customized, as desired for a given target application or end-use. The dopant concentration, as well as the doping profile (e.g., dopant gradient or other variation, if any), for diode material layer 330 may be customized. In some cases, diode material layer 330 may have a dopant concentration, for example, in the range of about 1E20-1 E22 cm"3 (e.g., about 1E20-1E21 cm"3, about 1 E21-1E22 cm"3, or any other sub-range. If source portion 308 is n-doped, for example, then diode material layer 330 may be any one, or combination, of highly p-doped Si, SiGe, and Ge, resulting in a P+ diode material layer 330. If instead source portion 328a is p-doped, for example, then diode material layer 330 may be any one, or combination, of highly n-doped Si, SiGe, and Ge, resulting in an N+ diode material layer 330. In either case, the P+ or N+ diode material layer 330 over source/drains 328, may provide a tunnel diode portion 315 in accordance with some embodiments. After formation of diode portion 315, the mask is removed from feature(s) within dielectric layer and source/drain contacts 332 are formed over the diode material layer 330 and source/drains 328.

Figure 3:
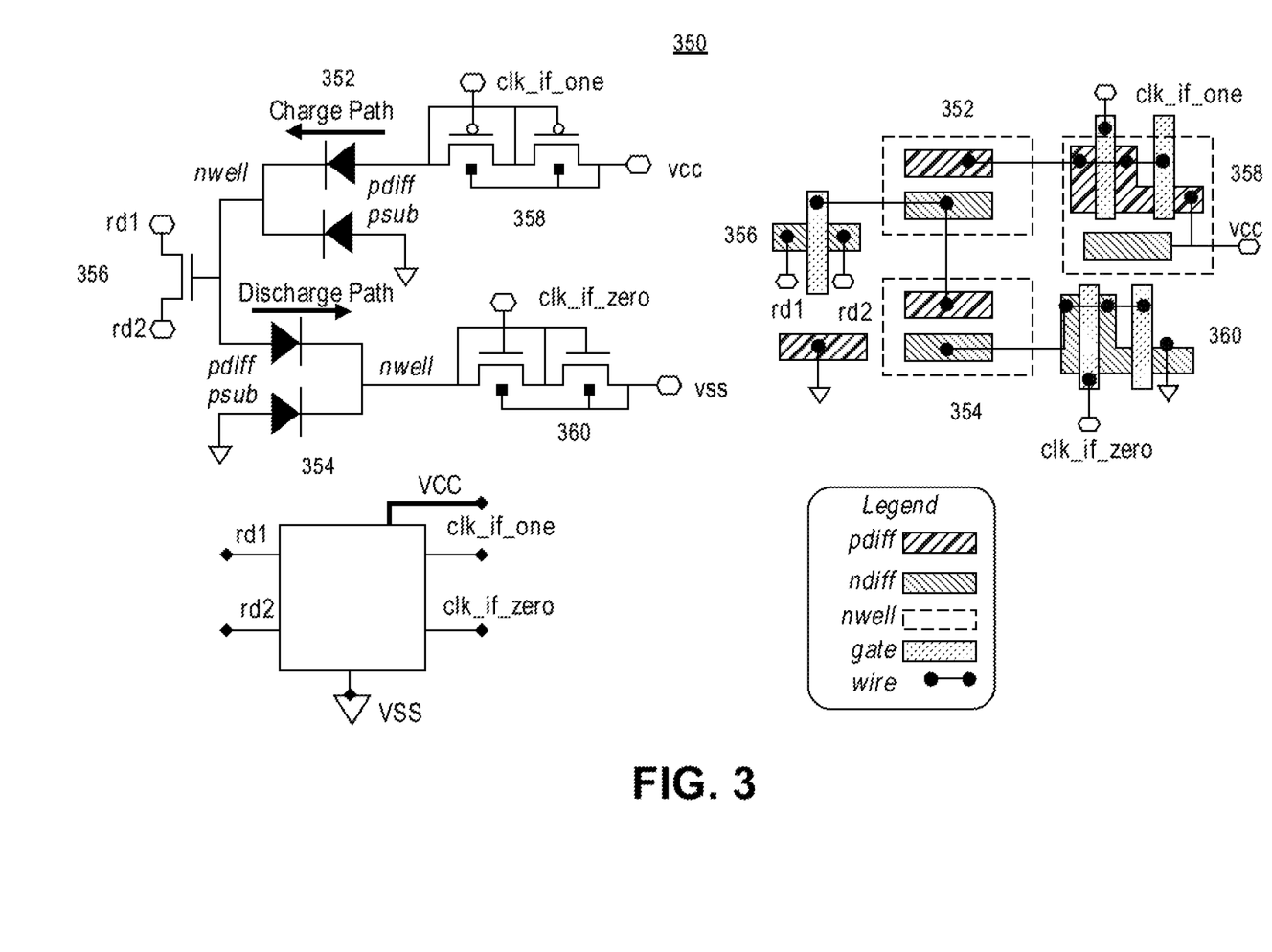
FIG. 3 is a diagram illustrating various views of an example circuit configuration for data retention during power gating using diodes.

FIG. 3 is a diagram illustrating various views of an example circuit configuration for data retention during power gating using diodes. In one embodiment, the circuit configuration comprises an example two stage charge pump.

The block diagram in the lower left shows connections to an integrated circuit 300, where the connections may include VCC, a first clock signal (clk_if_one), a second clock signal (clk_if_zero), VSS/ground, and latch outputs RD1 and RD2.

The diagram in the upper left shows details of the components comprising integrated circuit 350. The components may include a first set of parallel diodes (pdiff and psub) forming a charge path 352 and a second set of parallel diodes (pdiff and psub) forming a discharge path 354. The psub diodes are coupled to ground. A MOSFET transistor forms a latch 356, which includes a source (RD1), a drain (RD2) and a floating gate, where the charge on the floating gate, or the gate voltage, depends on currents leaking from the first set of parallel diodes in the charge path 352. The charge path 352 is coupled to a first clock circuit (clk_if_one) 358, while the discharge path 354 is coupled to a second clock circuit (clk_if_zero) 360.

In operation, when the content of a memory device is a "1", the first clock signal (clk_if_one) turns sending VCC to the charge path 352 causing the first set of parallel diodes in the charge path 352 to leak charges to the floating gate of the latch 356, which writes a "1" state to latch 356. When the content of the memory device is a "zero", the second clock signal (clk_if_zero) turns on causing the second set of parallel diodes in the discharge path 35 to discharge all of their voltage down to zero VSS, since the second set of parallel diodes is coupled to VSS. When a bias is applied across source (RD1) and drain (RD2) of the latch 356, a read is initiated. If a "1" state is stored, the latch 356 generates a large/high current, which is interpreted as an On state. If a "zero" state is stored, the latch 356 generates a relatively small/low current, which is interpreted as an Off state. In one embodiment, the output of the latch 356 is connected to other circuits (not shown) for use during power gating.

The upper left of FIG. 3 shows a layout view of the integrated circuit 350, where black lines show interconnections between devices and different types of diffusion regions P-type diffusion (pdiff), N-type diffusion (ndiff), Nwell and gates are also shown. The gate of the latch 356 is shown connected to one of the diodes in the charge path 352 and to one of the diodes and the discharge path 354. The pdiff diode in the charge path 352 is coupled to the clk_if_one circuit 358, which is a transistor having VCC connections. Similarly, the ndiff diode in the discharge path is coupled to the clk_if_zero circuit 360 which is a transistor having VSS connections.

Referring to FIGS. 2A, 2B and 3, in terms of implementation, the charge path 352 and discharge path 354 could be implemented in the memory region 208/308 of FIGS. 2A and 2B; the clk_if_one circuit 358 and the clk_if_zero circuit 360 could be implemented in the in Nwell 206/306 section of the logic region 210/310; and the latch 356 could be implemented in a Pwell section of the logic region 210/310 (not shown).

Figure 4:
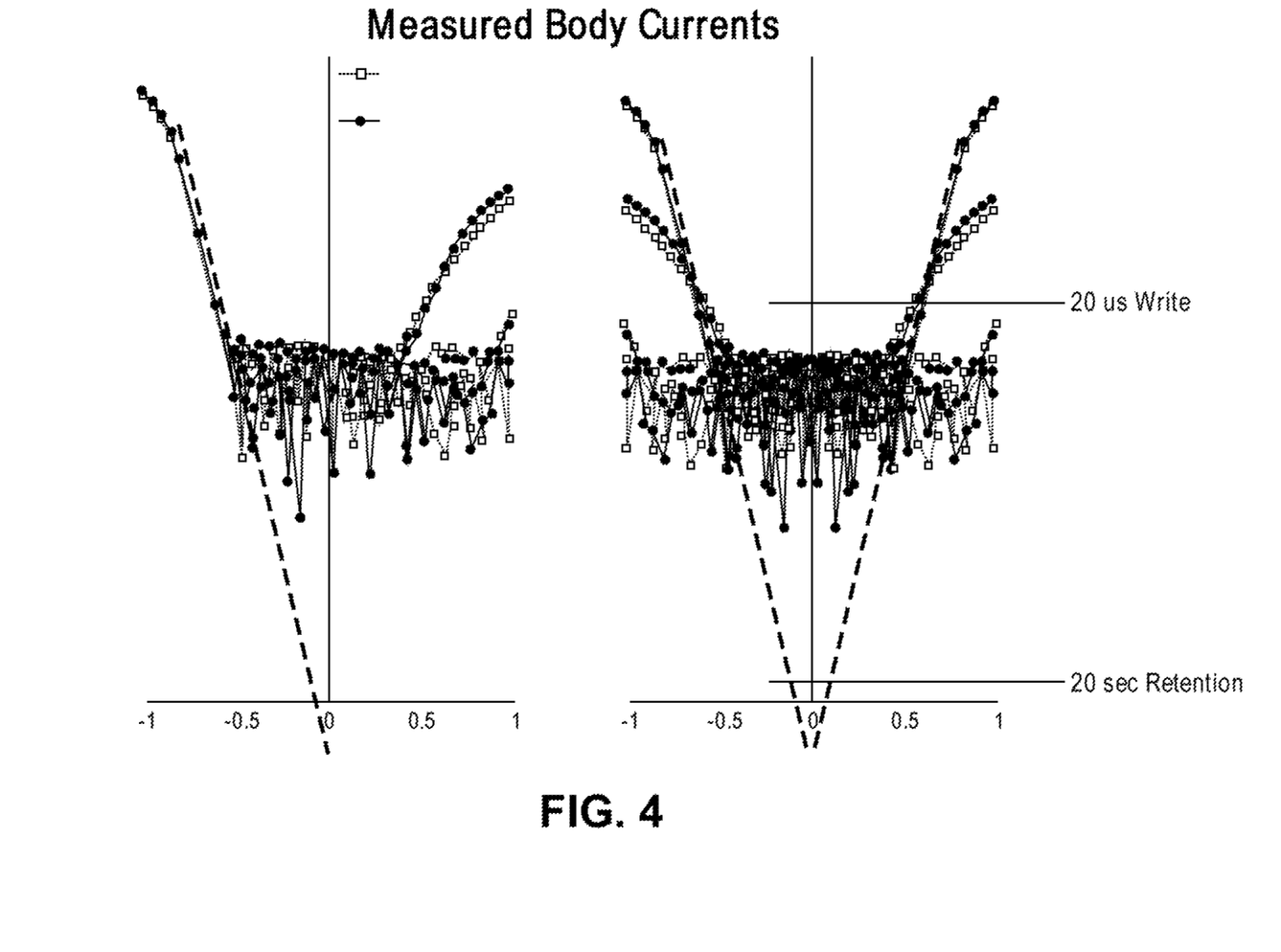
FIG. 4 illustrates measured and simulated diode I-V curves are shown.

FIG. 4 illustrates measured and simulated diode I-V curves are shown. The I-V curve on the left is for a source/drain to body diode of a CMOS transistor formed between a drain structure and an Nwell. The left-hand graph is a conventional diode current called a diode internal current, and the right-hand side graph is a tunneling current for parallel diodes corresponding to the embodiment of FIG. 2B and FIG. 3. The existing characteristics are suitable for some applications. At high negative voltage, measured noise level increases and the current cannot be measured. As voltage turns positive, the current rises above the noise levels. The diode should engineered to have super-ultra-low IOFF, low turn-on voltage and steep I-V characteristic (e.g., a subthreshold swing of −100 mV/dec is suitable). The I-V curve on the right shows current through parallel diodes that have an estimated retention time of 20 seconds after voltage goes to zero, which is more than enough time to turn on/off a processor during power gating, for example. The write time is about 20 microseconds.

Figure 5:
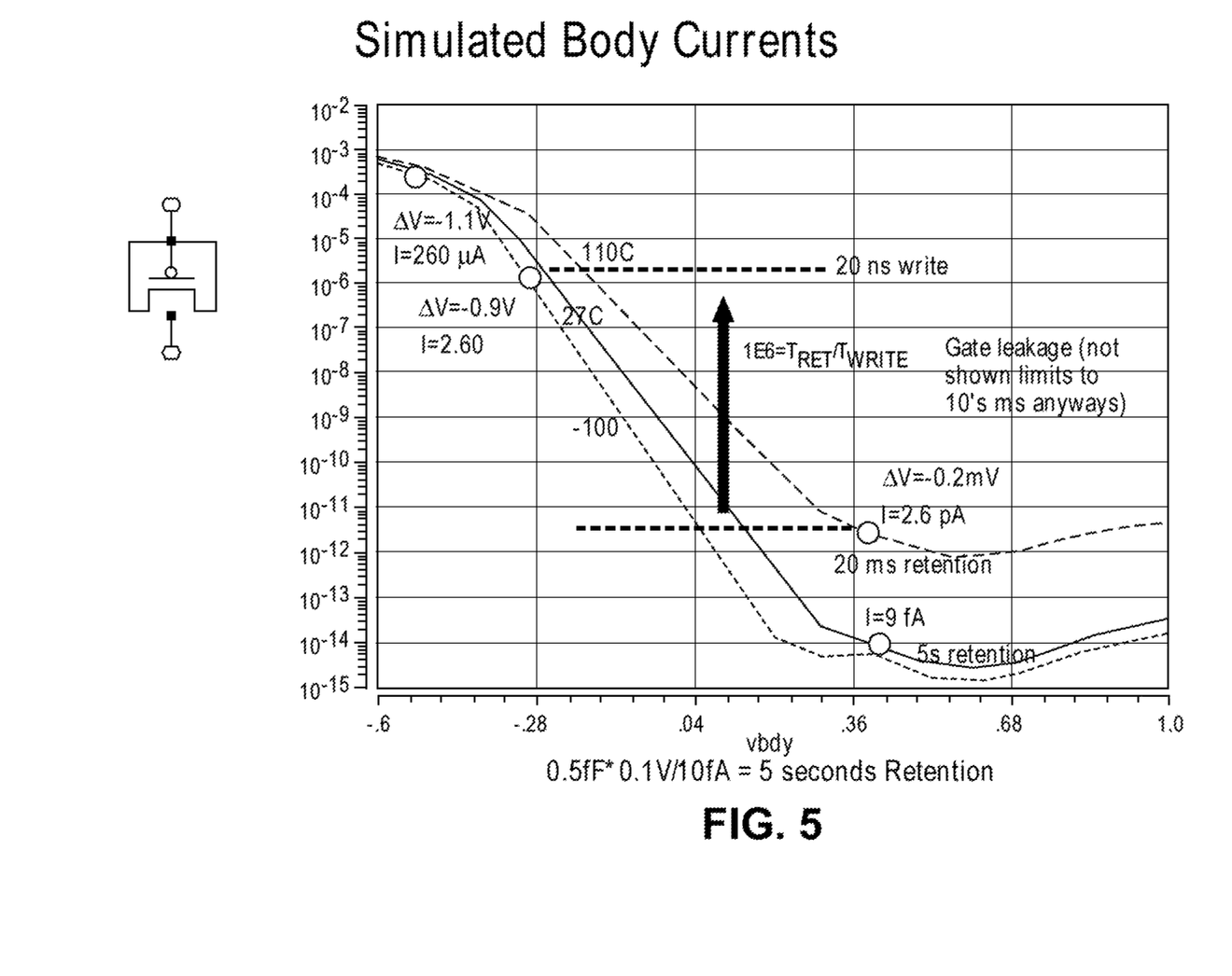
FIG. 5 illustrates a simulated current-voltage (I-V) curve of body currents of the transistor model of FIG. 1 and FIG. 2A over various temperature ranges.

FIG. 5 illustrates a simulated current-voltage (I-V) curve of body currents of the transistor model of FIG. 1 and FIG. 2A over various temperature ranges. The highest temperature range produces the highest retention time of 20 ms, while the lowest temperature range produces the lowest retention time of 5 sec. Write times are approximately 20 ns. The retention time divided by the write time is approximately 1E16.

One or more embodiments have described a logic-embedded diode/tunnel diode coupled to a floating gate, which retains logic state during power gating. The logic-embedded diode/tunnel diodes of the present embodiments provide an improved write voltage vs retention time trade-off.

The integrated circuit structures described herein may be included in an electronic device. As an example of one such apparatus, FIGS. 6A and 6B are top views of a wafer and dies that include one or more logic-embedded or tunnel diodes coupled to floating gates with I-V suitable for logic state retention, in accordance with one or more of the embodiments disclosed herein.

Figure 6A:
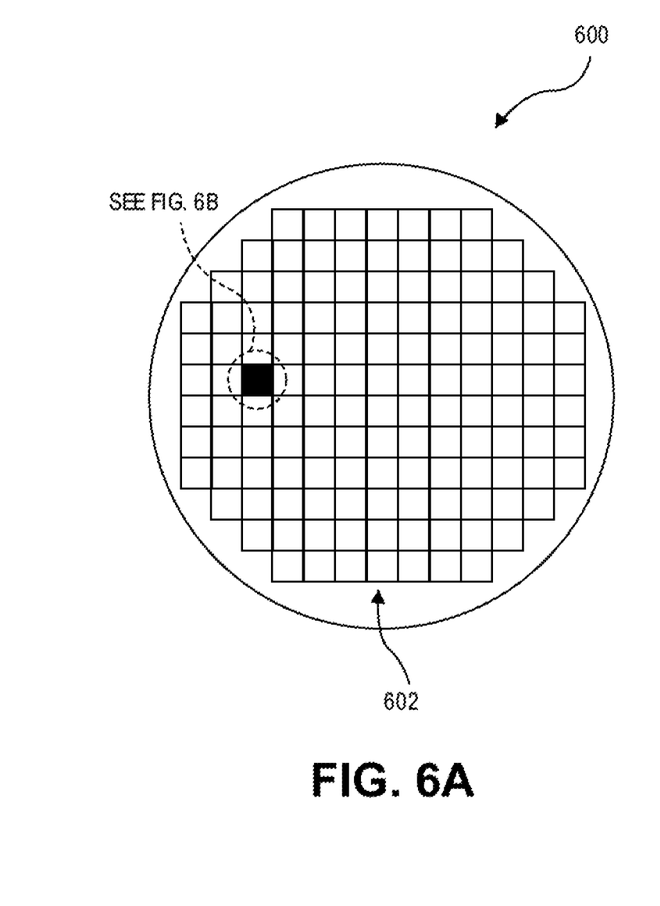
FIGS. 6A and 6B are top views of a wafer and dies that include one or more logic-embedded or tunnel diodes coupled to floating gates with I-V suitable for logic state retention, in accordance with one or more of the embodiments disclosed herein.
Figure 6B:
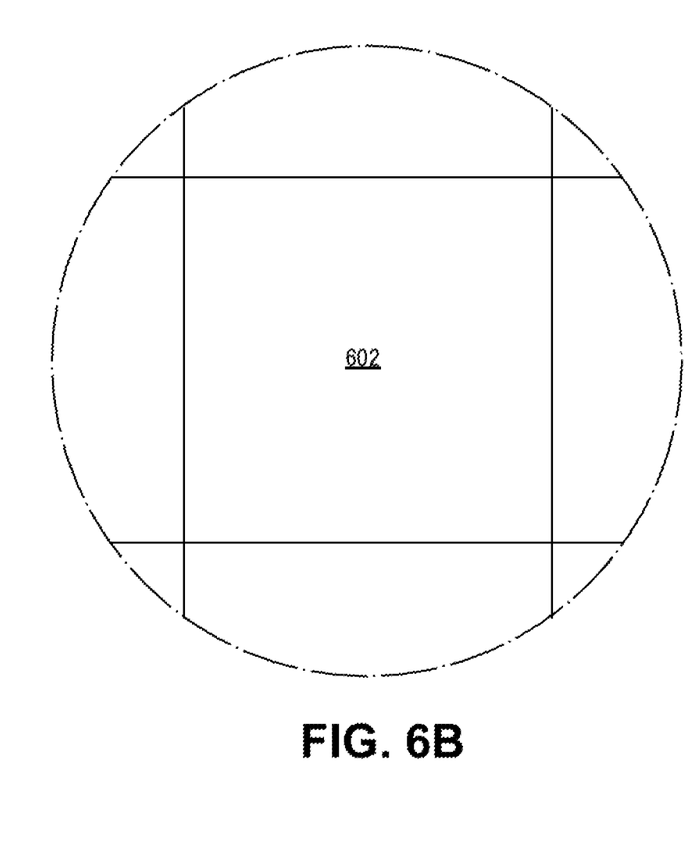

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more logic-embedded or tunnel diodes coupled to floating gates with I-V suitable for logic state retention, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
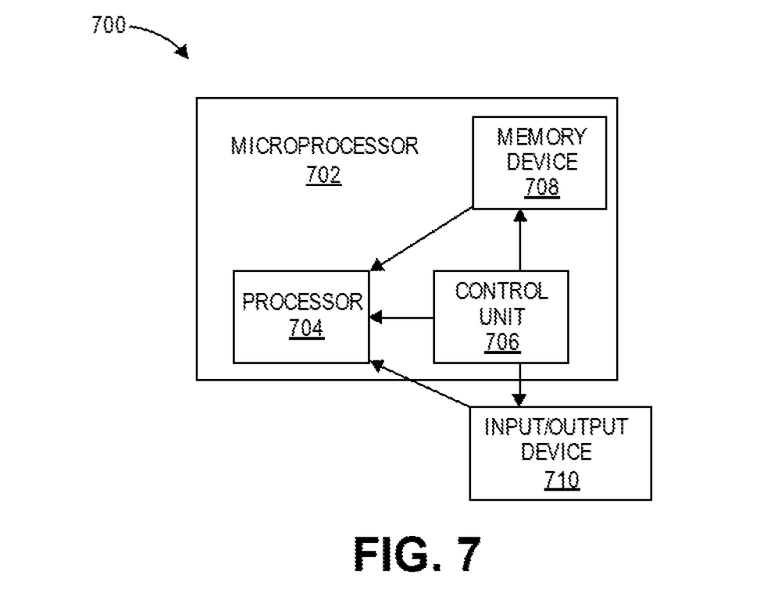
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more logic-embedded or tunnel diodes coupled to floating gates with I-V suitable for logic state retention, such as those described herein.

Figure 8:
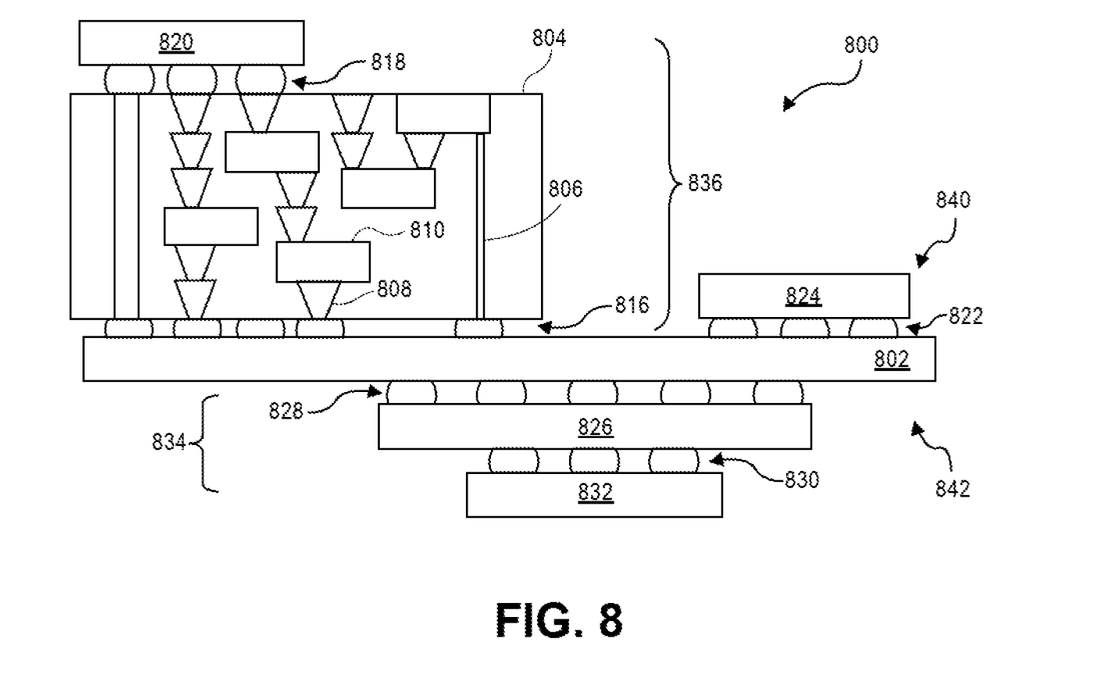
FIG. 8 is a cross-sectional side view of an integrated circuit (IC) device assembly that may include one or more logic-embedded or tunnel diodes coupled to floating gates with I-V suitable for logic state retention, in accordance with one or more of the embodiments disclosed herein.

FIG. 8 is a cross-sectional side view of an integrated circuit (IC) device assembly that may include one or more logic-embedded or tunnel diodes coupled to floating gates with I-V suitable for logic state retention, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of logic-embedded or tunnel diodes coupled to floating gates with I-V suitable for logic state retention, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 702 of FIG. 6B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
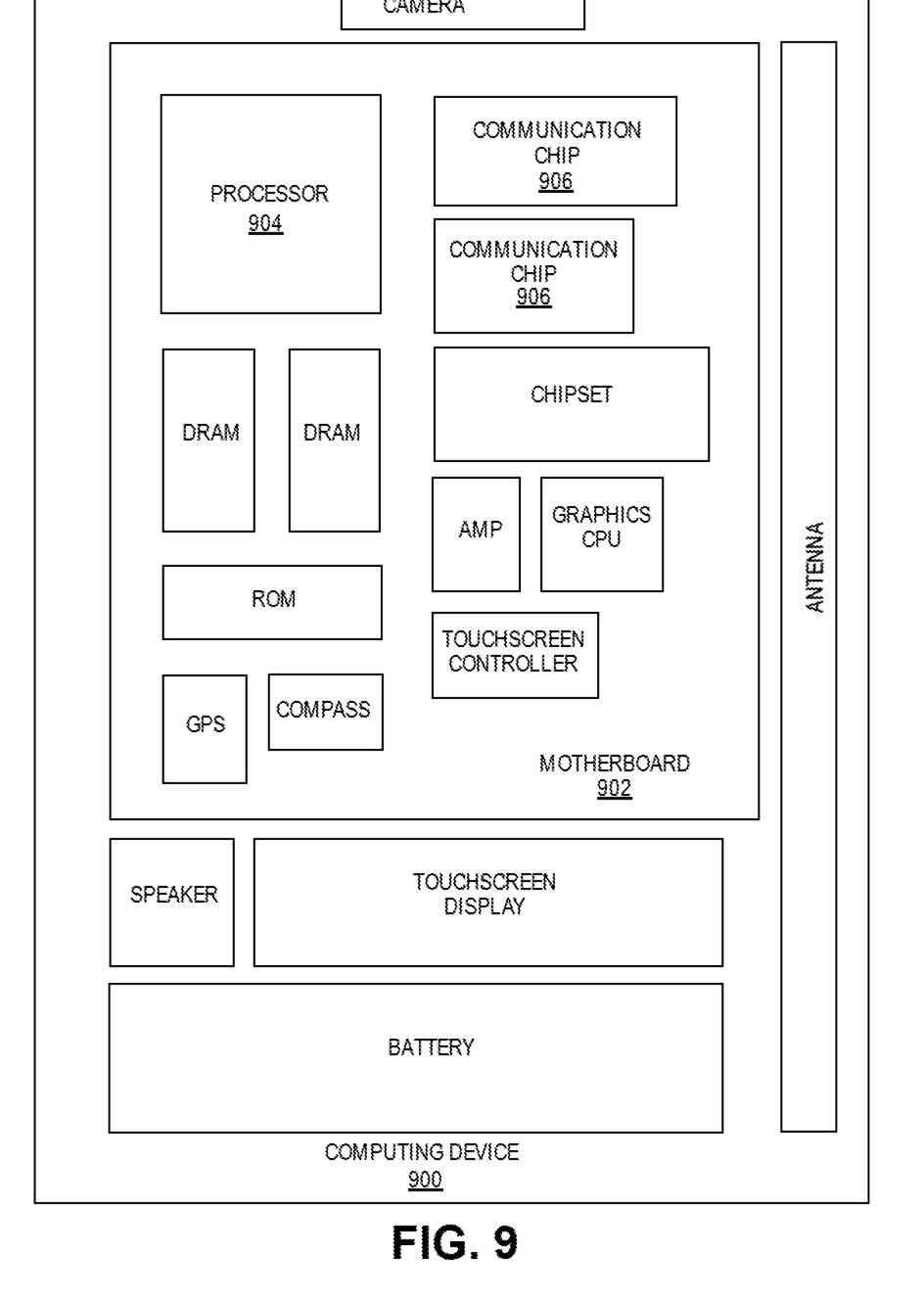
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more logic-embedded or tunnel diodes coupled to floating gates with I-V suitable for logic state retention, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more logic-embedded or tunnel diodes coupled to floating gates with I-V suitable for logic state retention, in accordance with implementations of embodiments of the disclosure.

In further implementations, another component housed within the computing device 900 may contain an integrated circuit die that includes one or more logic-embedded or tunnel diodes coupled to floating gates with I-V suitable for logic state retention, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include a logic-embedded or tunnel diode coupled to a floating gate with I-V suitable for logic state retention.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure comprises a substrate having a memory region of and an adjacent logic region. A plurality of memory transistors in the memory region and a plurality of logic transistors are in the logic region, wherein ones the memory transistors include a floating gate over a channel, and a source and a drain on opposite sides of the channel. A diode portion is formed over one of the source and the drain of at least one of the memory transistors to conduct charge to the floating-gate of the at least one of the memory transistors for state retention during power gating.

Example Embodiment 2

The integrated circuit structure of example embodiment 1, wherein the substrate is P type substrate.

Example Embodiment 3

The integrated circuit structure of example embodiment 1 or 2, wherein the source and drain are n-doped and the diode portion is p-doped.

Example Embodiment 4

The integrated circuit structure of example embodiment 1 2 or 3, further comprising: a first N type well (Nwell) formed in the substrate for the memory region and a second Nwell formed in the substrate for the logic region.

Example Embodiment 5

The integrated circuit structure of example embodiment 4, wherein the Nwell is doped at a level of 1E15 to 1E16.

Example Embodiment 6

The integrated circuit structure of example embodiment 1, 2, 3, 4 or 5, wherein the channel is doped at a level of 1E16 to 1E18.

Example Embodiment 7

The integrated circuit structure of example embodiment 1, 2, 3, 4, 5 or 6, wherein the source and drain are doped at a level of 1E20 cm"3.

Example Embodiment 8

The integrated circuit structure of example embodiment 1, 2, 3, 4, 5, 6, or 7, wherein the diode portion is doped at a level of 1E20-1 E22 cm"3.

Example Embodiment 9

The integrated circuit structure of example embodiment 1, 2, 3, 4, 5, 6, 7 or 8, wherein the diode portion comprises a tunnel diode.

Example Embodiment 10

The integrated circuit structure of example embodiment 1, 2, 3, 4, 5, 6, 7, 8 or 9, wherein the memory region further comprises: an anode portion coupling together diode portion of the source and drains and a cathode portion coupling together source and drains of an adjacent transistor to form a N+ tap.

Example Embodiment 11

An integrated circuit structure comprises a first set of parallel diodes forming a charge path. A second set of parallel diodes forms a discharge path. A latch is coupled to the first set of parallel diodes and the second set of parallel diodes, the latch comprising a source, a drain and a floating gate, wherein a charge on the floating gate depends on currents leaking from the first set of parallel diodes in the charge path.

Example Embodiment 12

The integrated circuit structure of example embodiment 11 further comprising: a first clock circuit coupled to the charge path and a second clock circuit coupled to the discharge path.

Example Embodiment 13

The integrated circuit structure of example embodiment 11 or 12 wherein: when a content of a memory device is a "1", the first clock signal turns sending VCC to the charge path causing the first set of parallel diodes to leak charges to the floating gate of the latch, writing a "1" state to the latch.

Example Embodiment 14

The integrated circuit structure of example embodiment 13 wherein: when the content of the memory device is a "zero", the second clock signal turns on causing the second set of parallel diodes to discharge their voltage.

Example Embodiment 15

The integrated circuit structure of example embodiment 14 wherein: When a bias is applied across the source and the drain of the latch, a read is initiated, such that if a "1" state is stored, the latch generates a large current, which is interpreted as an On state and a "zero" state is stored, the latch generates a small current, which is interpreted as an Off state.

Example Embodiment 16

A method of fabricating an integrated circuit comprises forming a substrate having a memory region of and an adjacent logic region. A plurality of memory transistors is formed in the memory region and a plurality of logic transistors is formed in the logic region, wherein ones the memory transistors include a floating gate over a channel, and a source and a drain are formed on opposite sides of the channel. A diode portion is formed over one of the source and the drain of at least one of the memory transistors to conduct charge to the floating-gate of the at least one of the memory transistors for state retention during power gating.

Example Embodiment 17

The method of example embodiment 16, wherein forming the diode portion further comprises: masking off feature(s) within a dielectric layer formed over the memory regions where formation of a diode material layer is not desired and forming the diode portion in feature(s) within dielectric layer over the source and drain where formation is desired.

Example Embodiment 18

The method of example embodiment 16 or 17, using a P type substrate for the substrate;

Example Embodiment 19

The method of example embodiment 16, 17, or 18, further comprising: n-doping the source and drain and p-doping the diode portion.

Example Embodiment 20

The method of example embodiment 16, 17, 18 or 19, further comprising: forming a first N type well (Nwell) in the substrate for the memory region and forming a second Nwell in the substrate for the logic region.

Example Embodiment 21

The method of example embodiment 20, further comprising: doping the Nwell at a level of 1E15 to 1E16 cm"3.

Example Embodiment 22

The method of example embodiment 16, 17, 18, 19, 20 or 21, further comprising: doping the channel at a level of 1E16 to 1E18 cm"3.

Example Embodiment 23

The method of example embodiment 16, 17, 18, 19, 20, 21 or 22, further comprising: doping the source and drain at a level of 1E20 cm"3.

Example Embodiment 24

The method of example embodiment 16, 17, 18, 19, 20, 21, 22 or 23, further comprising: doping the diode portion at a level of 1E20-1 E22 cm"3.

Example Embodiment 25

The method of example embodiment 16, 17, 18, 19, 20, 21, 22, 23 or 24, further comprising: forming the diode portion as a tunnel diode.

What is claimed is:

1. An integrated circuit structure, comprising:
   a substrate having a memory region of and an adjacent logic region;
   a plurality of memory transistors in the memory region and a plurality of logic transistors in the logic region, wherein ones the memory transistors include a floating gate over a channel, and a source and a drain on opposite sides of the channel; and
   a diode portion formed over one of the source and the drain of at least one of the memory transistors to conduct charge to the floating-gate of the at least one of the memory transistors for state retention during power gating.

2. The integrated circuit structure of claim 1, wherein the substrate is P type substrate.

3. The integrated circuit structure of claim 2, wherein the source and drain are n-doped and the diode portion is p-doped.

4. The integrated circuit structure of claim 1, further comprising:
   a first N type well (Nwell) formed in the substrate for the memory region and a second Nwell formed in the substrate for the logic region.

5. The integrated circuit structure of claim 3, wherein the Nwell is doped at a level of 1E15 to 1E16 cm$^{-3}$.

6. The integrated circuit structure of claim 1, wherein the channel is doped at a level of 1E16 to 1E18 cm$^{-3}$.

7. The integrated circuit structure of claim 1, wherein the source and drain are doped at a level of 1E20 cm$^{-3}$.

8. The integrated circuit structure of claim 1, wherein the diode portion is doped at a level of 1E20-1 E22 cm$^{-3}$.

9. The integrated circuit structure of claim 1, wherein the diode portion comprises a tunnel diode.

10. The integrated circuit structure of claim 1, wherein the memory region further comprises: an anode portion coupling together diode portion of the source and drains and a cathode portion coupling together source and drains of an adjacent transistor to form a N+ tap.

11. An integrated circuit structure, comprising:
    a first set of parallel diodes forming a charge path; a second set of parallel diodes forming a discharge path; and
    a latch coupled to the first set of parallel diodes and the second set of parallel diodes, the latch comprising a source, a drain and a floating gate, wherein a charge on the floating gate depends on currents leaking from the first set of parallel diodes in the charge path.

12. The integrated circuit of claim 11 further comprising:
    a first clock circuit coupled to the charge path and a second clock circuit coupled to the discharge path.

13. The integrated circuit of claim 12 wherein: when a content of a memory device is a "1", the first clock signal turns sending VCC to the charge path causing the first set of parallel diodes to leak charges to the floating gate of the latch, writing a "1" state to the latch.

14. The integrated circuit of claim 13 wherein: when the content of the memory device is a "zero", the second clock signal turns on causing the second set of parallel diodes to discharge their voltage.

15. The integrated circuit of claim 14 wherein: When a bias is applied across the source and the drain of the latch, a read is initiated, such that if a "1" state is stored, the latch generates a large current, which is interpreted as an On state and a "zero" state is stored, the latch generates a small current, which is interpreted as an Off state.

* * * * *